United States Patent
Chiang et al.

(10) Patent No.: US 7,387,855 B2
(45) Date of Patent: Jun. 17, 2008

(54) ANTI-ESD PHOTOMASK BLANK

(75) Inventors: Eric Chiang, Miao-Li (TW); Hung-Chun Wang, Ching-shuei (TW); Min-Chih Hsieh, Hsin-Chu County (TW); Ming-Tao Ho, Hsin-Chu (TW)

(73) Assignee: Taiwan Semiconductor Manufacturing Co., Ltd

( * ) Notice: Subject to any disclaimer, the term of this patent is extended or adjusted under 35 U.S.C. 154(b) by 501 days.

(21) Appl. No.: 11/032,793

(22) Filed: Jan. 10, 2005

(65) Prior Publication Data

US 2006/0154153 A1 Jul. 13, 2006

(51) Int. Cl.
*G03F 1/00* (2006.01)
*B32B 17/10* (2006.01)

(52) U.S. Cl. .......................................... 430/5; 428/430

(58) Field of Classification Search ................... 430/5; 250/492.2; 438/275, 285
See application file for complete search history.

(56) References Cited

U.S. PATENT DOCUMENTS

| 6,180,291 | B1 * | 1/2001 | Bessy et al. | 430/5 |
| 6,440,617 | B1 * | 8/2002 | Deng et al. | 430/5 |
| 6,803,156 | B2 * | 10/2004 | Akbar | 430/5 |
| 6,869,733 | B1 * | 3/2005 | Su | 430/5 |
| 7,029,800 | B2 * | 4/2006 | Su et al. | 430/5 |

* cited by examiner

*Primary Examiner*—Stephen Rosasco
(74) *Attorney, Agent, or Firm*—Tung & Associates

(57) ABSTRACT

An anti-electrostatic discharge photomask blank for fabrication of an anti-electrostatic discharge photomask is disclosed. The anti-electrostatic discharge photomask blank includes a mask substrate, a conductive layer provided on the mask substrate and an opaque patterning layer provided on the conductive layer. The conductive layer prevents charges of opposite polarity from accumulating on a photomask fabricated from the photomask blank, thus preventing electrostatic discharges on the photomask.

20 Claims, 4 Drawing Sheets

ANTI-ESD PHOTOMASK BLANK

FIELD OF THE INVENTION

The present invention relates to photomasks used to transfer circuit patterns onto semiconductor wafers in the fabrication of integrated circuits. More particularly, the present invention relates to an anti-electrostatic discharge (ESD) photomask blank for fabrication of a photomask, which anti-ESD photomask blank includes a conductive layer interposed between a patterning layer such as chromium and a mask substrate to eliminate electrostatic discharges on the photomask.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

During the photolithography step of semiconductor production, light energy is applied through a photomask onto the photoresist material previously deposited on the wafer to define circuit patterns which will be etched in a subsequent processing step to define the circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer. Reticles are used for step-and-repeat steppers and step-and-scan systems found in wafer fabrication.

Reticles and photomasks must remain meticulously clean for the creation of perfect images during its many exposures to pattern a circuit configuration on a substrate. Reticles and photomasks may be easily damaged such as by dropping, by the formation of scratches on the reticle or photomask surface, electrostatic discharge (ESD), and particles. ESD can cause discharge of a small current through the chromium lines on the surface of the reticle or photomask, melting a circuit line and destroying the circuit pattern. The terms "photomask" and "reticle" shall be used interchangeably herein.

A photomask blank 10 shown in FIG. 1A is used to fabricate a conventional photomask 10a shown in FIG. 1B. As shown in FIG. 1A, the mask blank 10 includes a transparent mask substrate 12 which is typically quartz or fused silica, an opaque patterning layer 14 such as chromium provided on the mask substrate 12, and a photoresist layer 16 on the patterning layer 14. Throughout fabrication of the photomask 10a, the photoresist layer 16 is exposed, baked and developed, respectively, to form exposure openings (not shown) therein. A patterned layer 14a, having exposure openings 15 as shown in FIG. 1B, is formed by etching the patterning layer 14 according to the circuit pattern of the overlying photoresist layer 16.

Throughout the course of using, transferring or storing a reticle or photomask in a semiconductor production facility, static electricity has a tendency to accumulate and form an electric field on the mask. Voltage differences are frequently established between adjacent portions of a patterned chromium layer on a photomask, resulting in electrostatic discharges on the photomask. These electrostatic discharges on the surface of the photomask may burn or melt the patterned chromium layer. Consequently, the circuit pattern image transferred through the mask can be distorted, compromising pattern reliability and causing severe yield loss.

Accordingly, a novel anti-ESD photomask blank having a conductive layer for the fabrication of anti-ESD photomasks is needed to maintain all portions of a patterned chromium layer on a photomask at the same voltage potential and prevent electrostatic discharges from occurring on the photomask.

SUMMARY OF THE INVENTION

The present invention is generally directed to a novel anti-ESD photomask blank which can be used for the fabrication of an anti-ESD photomask. The anti-ESD photomask blank includes a transparent mask substrate, a conductive layer provided on the mask substrate, an patterning layer such as chromium provided on the conductive layer and a photoresist layer provided on the patterning layer. An anti-ESD mask can be fabricated from the anti-ESD mask blank by exposure, baking and development, respectively, of the photoresist layer; etching of the patterning layer according to the pattern defined by the photoresist layer to define a patterned layer having the desired circuit pattern; and stripping of the photoresist layer from the patterned layer. The conductive layer establishes electrical continuity between all areas or regions of the patterned layer, thus preventing the formation of voltage differences on the patterned layer which could cause electrostatic discharges that could damage the photomask. Consequently, photomask quality is enhanced and photomask cycle time delay due to electrostatic discharges is reduced.

BRIEF DESCRIPTION OF THE DRAWINGS

The invention will now be described, by way of example, with reference to the accompanying drawings, in which.

DETAILED DESCRIPTION OF THE INVENTION

The present invention contemplates a novel anti-ESD photomask blank which is used as the starting material for the fabrication of an anti-ESD photomask. The anti-ESD photomask blank includes a transparent mask substrate such as quartz or fused silica. An electrically-conductive layer is provided on the mask substrate. An opaque patterning layer, which may be chromium, for example, is provided on the conductive layer, and a photoresist layer is provided on the patterning layer. An anti-ESD photomask is fabricated from the anti-ESD mask blank typically using conventional fabrication techniques, with the patterning layer etched into a patterned layer having the desired circuit pattern. During storage, transport or use of the anti-ESD photomask, the conductive layer establishes electrical communication between all areas or regions of the patterned layer, thus preventing the formation of voltage differences on the patterned layer which could cause electrostatic discharges that could damage the photomask.

Figure 1A:
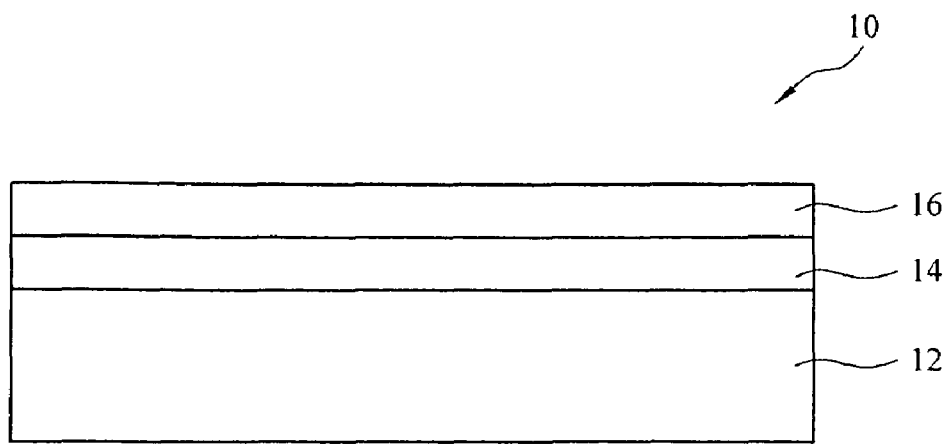
FIG. 1A is a cross-section of a conventional photomask blank.
Figure 1B:
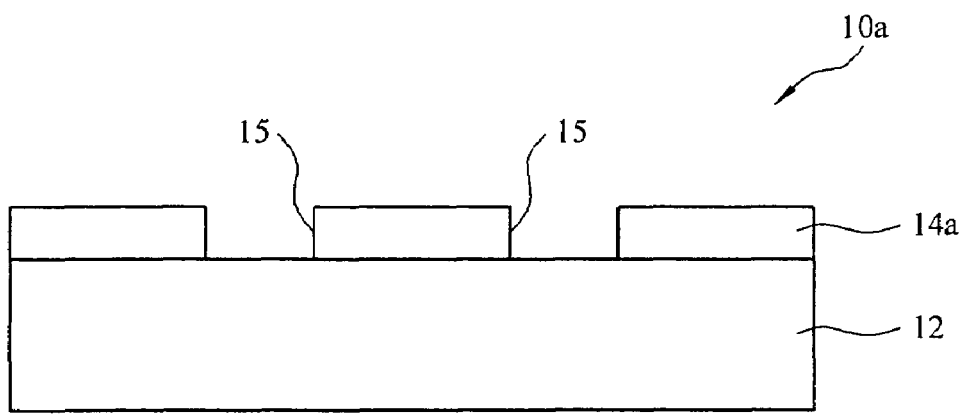
FIG. 1B is a cross-section of a conventional photomask fabricated from the photomask blank of FIG. 1A.
Figure 2A:
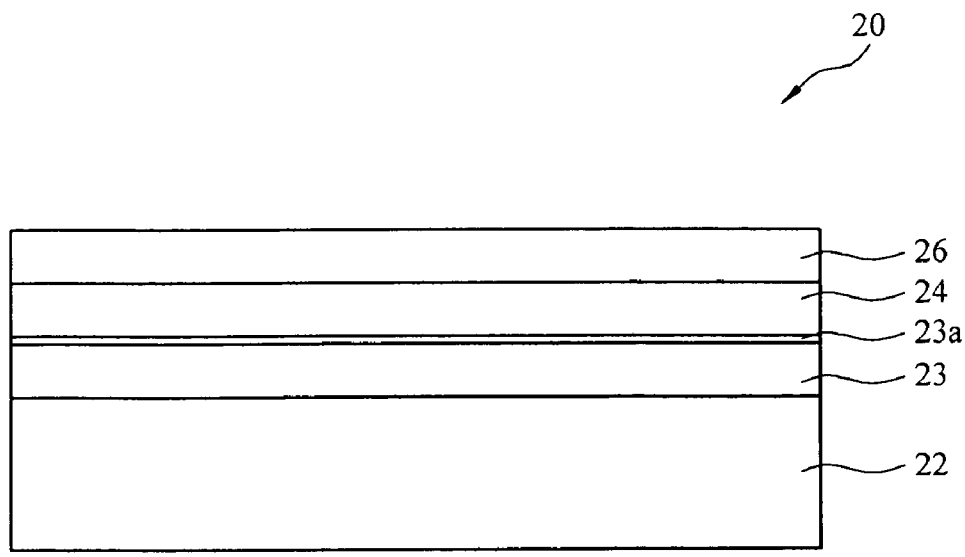
FIG. 2A is a cross-section of an anti-ESD photomask blank of the present invention.

Referring to FIG. 2A, an illustrative embodiment of the anti-ESD photomask blank of the present invention is generally indicated by reference numeral 20. The anti-ESD photomask blank 20 can be fabricated using conventional deposition techniques known by those skilled in the art. The anti-ESD photomask blank 20 includes a mask substrate 22 which is a transparent or translucent material such as quartz or fused silica, for example. A conductive layer 23 is provided on the mask substrate 22. The conductive layer 23 may be any suitable electrically-conductive material known by those skilled in the art which is capable of transmitting light having a wavelength of less than typically about 248 nm at a transmission of greater than 90% (vs. air). Preferably, the conductive layer 23 is indium tin oxide (ITO) and has a thickness of typically about 0.4 mm-3.0 mm. An anti-reflective coating 23a such as silicon dioxide, for example, and having a thickness of typically at least about 50 angstroms, may be provided on the conductive layer 23. An opaque patterning layer 24 is provided on the conductive layer 23 or anti-reflective coating 23a. Preferably, the patterning layer 24 is chromium. A photoresist layer 26 is provided on the patterning layer 24.

Figure 2B:
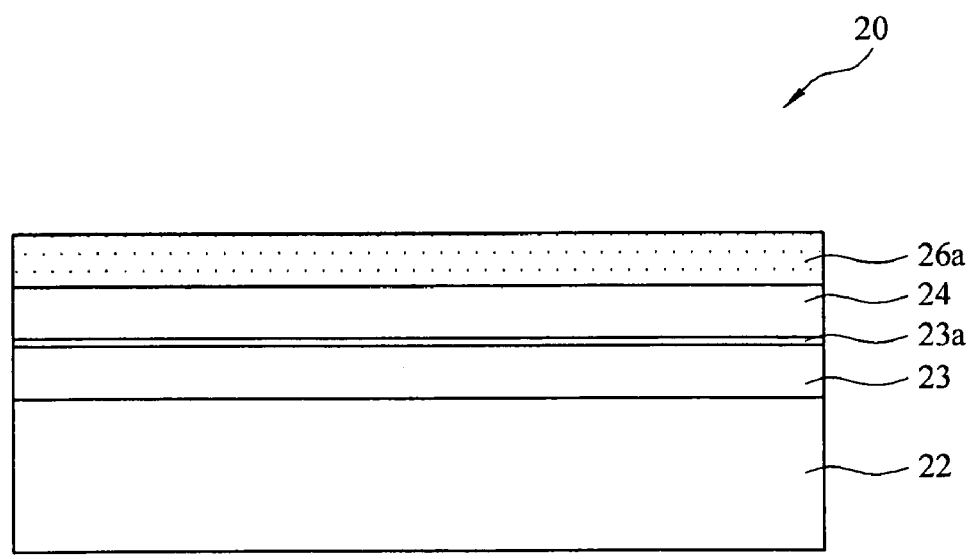
FIGS. 2B-2F are cross-sectional views illustrating sequential fabrication of an anti-ESD photomask from the anti-ESD photomask blank of FIG. 2A.
Figure 2C:
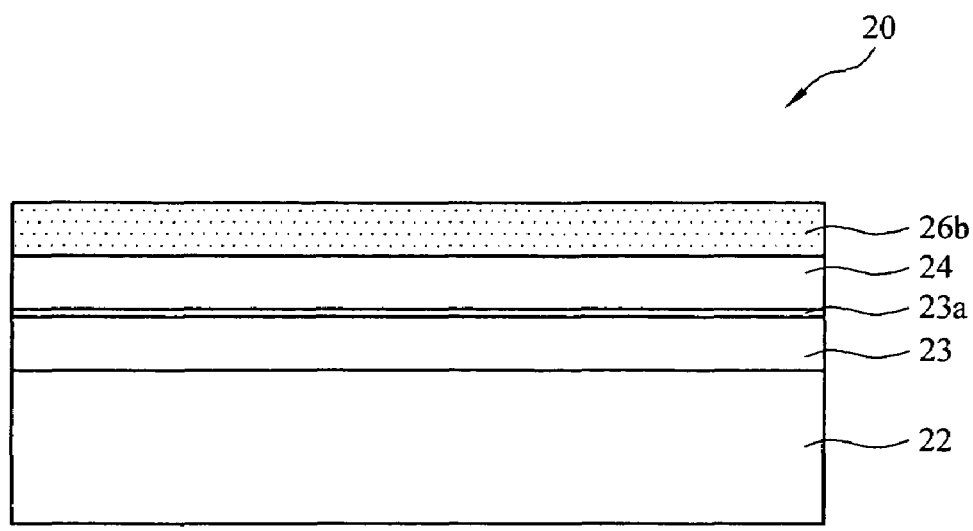

Referring next to FIGS. 2B-2F, an anti-ESD photomask 20a (FIG. 2F) is sequentially fabricated from the anti-ESD photomask blank 20. Fabrication of the anti-ESD photomask 20a may be carried out using conventional photoresist exposure, baking and development, metal etching and photoresist-stripping techniques known by those skilled in the art, as will be hereinafter described. The photoresist layer 26 of the anti-ESD photomask blank 20 is initially subjected to an exposure step to form an exposed photoresist layer 26a, as shown in FIG. 2B. The exposed photoresist layer 26a defines the circuit pattern to be subsequently formed in the underlying patterning layer 24, as will be hereinafter described. Next, the exposed photoresist layer 26a of FIG. 2B is baked to form a baked photoresist layer 26b, as shown in FIG. 2C.

Figure 2D:
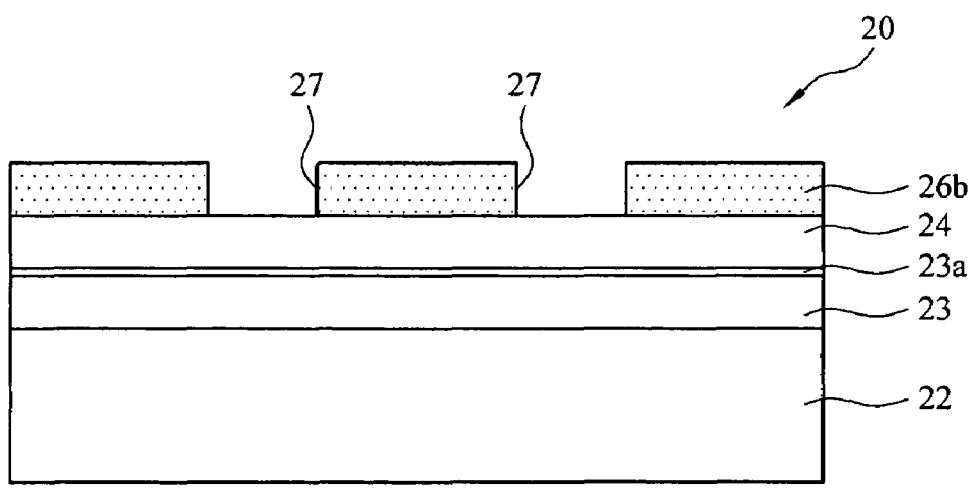
Figure 2E:
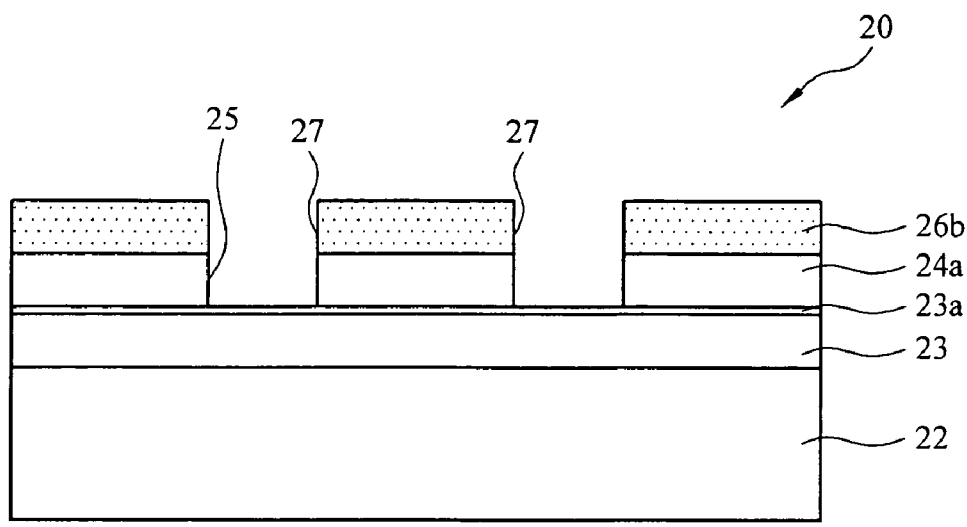
Figure 2F:
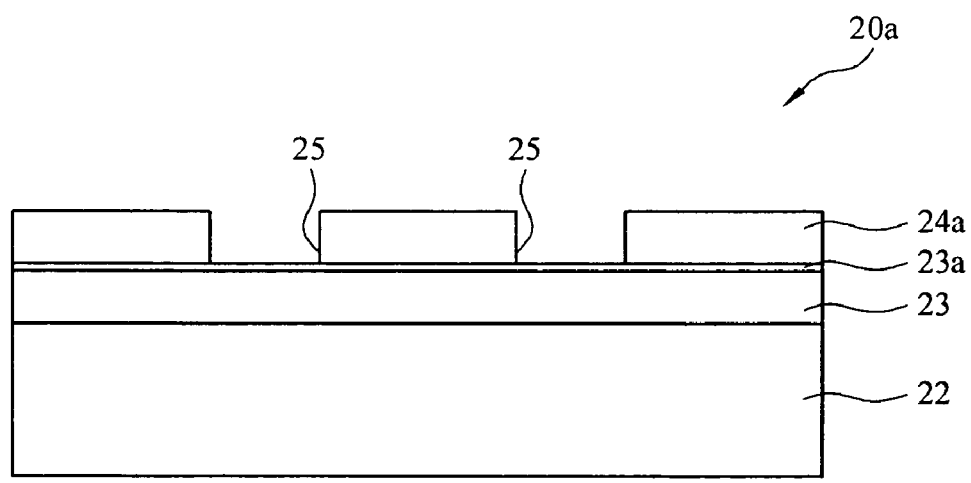

As shown in FIG. 2D, the baked photoresist layer 26b is then developed to form exposure openings 27 which correspond to the circuit pattern image to be subsequently etched into the underlying patterning layer 24. The patterning layer 24 is next typically subjected to a dry-etching step to etch exposure openings 25 in the patterning layer 24 according to the circuit pattern defined by the exposure openings 27 in the photoresist layer 26b, as shown in FIG. 2E. This results in the formation of a patterned layer 24a having the exposure openings 27. Etching of the patterning layer 24 stops at the conductive layer 23 or anti-reflective coating 23a to maintain continuity of the conductive layer 23. The patterned and baked photoresist layer 26b shields the non-etched portions of the underlying patterning layer 24. Finally, the photoresist layer 26b is stripped from the patterned layer 24a, as shown in FIG. 2F, to complete fabrication of the anti-ESD photomask 20a.

In use of the anti-ESD photomask 20a, during a photolithography exposure process, light (not shown) is transmitted through the exposure openings 25 of the patterned layer 24a, the conductive layer 23 and the transparent mask substrate 22 and impinges on a photoresist (not shown) deposited on a wafer (not shown) to transfer the circuit pattern defined by the exposure openings 25 to the photoresist, as is known by those skilled in the art. The portions of the patterned layer 24a which remain on the mask substrate 22 shield the photoresist on the wafer from the light transmitted through the photomask 10 in the form of the circuit pattern defined by the exposure openings 25.

During use, transport or storage of the anti-ESD photomask 20a, the conductive layer 23 maintains electrical communication among all regions of the patterned layer 24a. This prevents the accumulation of electrical charges of opposite polarity on physically separated regions of the patterned layer 24a. Consequently, all regions of the patterned layer 24a remain at substantially the same voltage potential. This prevents electrostatic discharges from occurring on the anti-ESD photomask 20a, thereby preventing damage to the circuit pattern defined by the patterning layer 24a and preserving the integrity of the circuit pattern image transferred to the photoresist layer (not shown) on the wafer (not shown).

While the preferred embodiments of the invention have been described above, it will be recognized and understood that various modifications can be made in the invention and the appended claims are intended to cover all such modifications which may fall within the spirit and scope of the invention.

What is claimed is:

1. An anti-electrostatic discharge photomask blank comprising:
    a mask substrate;
    a conductive layer provided on said mask substrate;
    an anti-reflective coating layer provided on said conductive layer; and
    an opaque patterning layer provided on said anti-reflective coating layer.

2. The anti-electrostatic discharge photomask blank of claim 1 wherein said mask substrate comprises quartz.

3. The anti-electrostatic discharge photomask blank of claim 1 wherein said mask substrate comprises fused silica.

4. The anti-electrostatic discharge photomask blank of claim 1 wherein said conductive layer comprises indium tin oxide.

5. The anti-electrostatic discharge photomask blank of claim 4 wherein said conductive layer has a thickness of from about 0.4 mm to about 3.0 mm.

6. The anti-electrostatic discharge photomask blank of claim 1 wherein said patterning layer comprises chromium.

7. The anti-electrostatic discharge photomask blank of claim 1 wherein said anti-reflective coating layer comprises silicon dioxide.

8. The anti-electrostatic discharge photomask blank of claim 1 wherein said conductive layer has a light transmittance of greater than 90 percent.

9. An anti-electrostatic discharge photomask blank comprising:
   a mask substrate;
   a conductive layer provided on said mask substrate;
   an anti-reflective coating layer provided on said conductive layer;
   an opaque patterning layer provided on said anti-reflective coating layer; and
   a photoresist layer provided on said patterning layer.

10. The anti-electrostatic discharge photomask blank of claim 9 wherein said mask substrate is a material selected from the group consisting of quartz and fused silica.

11. The anti-electrostatic discharge photomask blank of claim 9 wherein said conductive layer comprises indium tin oxide.

12. The anti-electrostatic discharge photomask blank claim 9 wherein said patterning layer comprises chromium.

13. The anti-electrostatic discharge photomask blank of claim 9 wherein said anti-reflective coating layer comprises silicon dioxide.

14. The anti-electrostatic discharge photomask blank of claim 9 wherein said conductive layer has a light transmittance of greater than 90 percent.

15. An anti-electrostatic discharge photomask comprising:
   a mask substrate;
   a conductive layer provided on said mask substrate;
   an anti-reflective coating layer provided on said conductive layer;
   an opaque patterned layer having exposure openings provided on said anti-reflective coating layer.

16. The anti-electrostatic discharge photomask of claim 15 wherein said mask substrate is a material selected from the group consisting of quartz and fused silica.

17. The anti-electrostatic discharge photomask of claim 15 wherein said conductive layer comprises indium tin oxide.

18. The anti-electrostatic discharge photomask of claim 15 claim 15 wherein said patterned layer comprises chromium.

19. The anti-electrostatic discharge photomask of claim 15 wherein said anti-reflective coating layer comprises silicon dioxide.

20. The anti-electrostatic discharge photomask of claim 15 wherein said conductive layer has a light transmittance of greater than 90 percent.

* * * * *